March 29, 1960 W. J. BASHARRAH 2,930,985

WIDE-BAND AMPLIFIER

Filed May 22, 1957 2 Sheets-Sheet 1

INVENTOR.
WILLIAM J. BASHARRAH

BY K L Miller

AGENT

March 29, 1960 W. J. BASHARRAH 2,930,985

WIDE-BAND AMPLIFIER

Filed May 22, 1957 2 Sheets-Sheet 2

INVENTOR.
WILLIAM J. BASHARRAH
BY
K L Miller
AGENT

United States Patent Office 2,930,985

Patented Mar. 29, 1960

2,930,985

WIDE-BAND AMPLIFIER

William Joseph Basharrah, Detroit, Mich., assignor to Burroughs Corporation, Detroit, Mich., a corporation of Michigan Application May 22, 1957, Serial No. 660,835

12 Claims. (Cl. 330—15)

This invention relates in general to amplifiers and more particularly to amplifiers capable of producing high power with small amounts of distortion.

In many applications, it is desirable to produce an amplifier having negligible distortion. The amplifiers of the prior art have suffered from this drawback, the attendant distortion being due primarily to imperfections in the coupling transformers and particularly in the output transformer. Push-pull amplifiers have become widely used to faithfully translate signals because such amplifiers cancel even order harmonics. However, nonsymmetry in impedance between the two portions of the primary windings are apt to unbalance the push-pull sources resulting in the presence of harmonic distortions.

A further source of difficulty encountered in high-efficiency amplifiers is due to leakage inductance between the primary windings of output transformers, and attention is directed primarily to an article by A. Pen-Tung Sah, in Proceedings of the I.R.E. for November, 1936. The article directs attention to the finding that especially in class B push-pull amplifiers the harmful effects of leakage inductance become increasingly important as frequencies increase causing decreasing outputs and transients which distort the waveform. In most output transformers, it has been found that loose coupling between the primary windings causes an increase in leakage inductance and consequently, distortion exists.

Therefore, one object of the invention is to provide an inexpensive output transformer which is simple in form.

Another of the objects of this invention is to provide an output transformer for a push-pull amplifier which will minimize distortion.

A further object of the invention is to provide signal coupling apparatus which will overcome the difficulties encountered in prior output transformers by decreasing harmonic distortion as well as by maintaining a constant output level over a wide range of frequencies. The above deficiencies as well as the further distortion caused by transients are minimized in the present invention by providing a transformer with coupling between various primary windings which approaches unity. It has been recognized that unity coupling is desired to decrease leakage inductance; however no prior art transformer is known which is constructed in the manner of the present invention to deliver high power with minimum distortion over a wide range of frequencies.

Prior art transistor amplifier circuits have been limited in the amount of available output power or have been wasteful of such output power, have required perfectly matched otput transistors and have been inherently unstable when operated over a wide range of frequencies.

Therefore, a further object of the invention is to provide a novel transistor amplifier circuit with improved performance characteristics.

A further object of the invention is to provide a novel transistor amplifier circuit connected with the improved transformer so as to furnish faithful signal reproduction.

The above and other objects and advantages of the present invention are particularly well achieved by the preferred embodiment of this invention including a novel transistor amplifier with pairs of output transistors connected in push-pull parallel form in a common collector arrangement and with the emitter electrodes of each push-pull pair connected to opposite ends of substantially unity coupled primary windings of a suitable output transformer.

The novel features of this invention are set forth with particularity in the appended claims. The invention itself, however, with its preferred organization and mode of operation as well as further objects and advantages, may best be understood from the following description when read with the accompanying drawings, in which:

Figure 1:
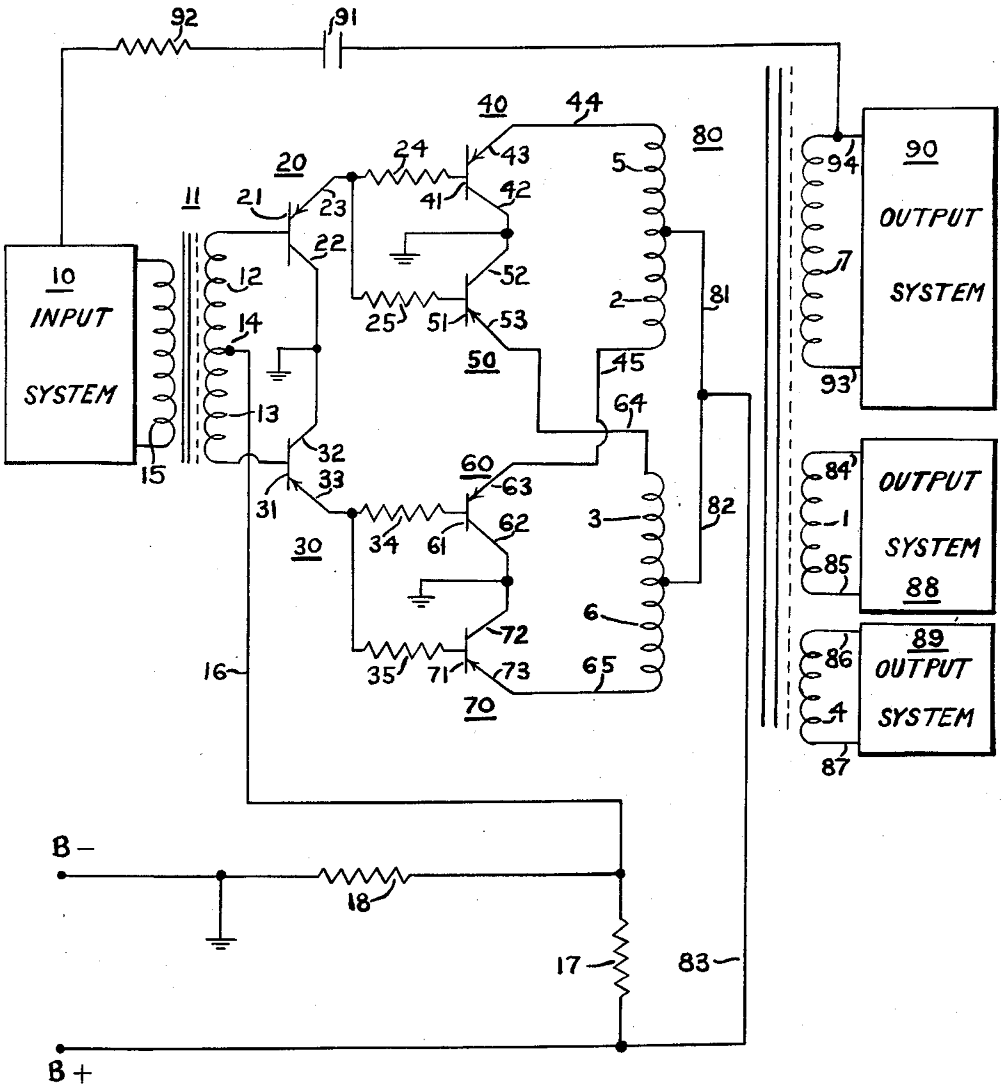
Fig. 1 is a schematic circuit diagram of a preferred embodiment of the invention showing a novel transistor broad-band amplifier circuit for providing high power output with faithful reproduction of input signals.

Referring now to the drawings and more particularly to Fig. 1, there is represented a preferred embodiment of the amplifier constructed in accordance with the invention and utilizing transformer windings also constructed in accordance with the invention, typical winding arrangements being described hereafter.

The amplifier of Fig. 1 illustrated as employing an input system 10 which is coupled to the primary winding 15 of a coupling transformer 11. The input system 10 may be taken as any supply of audio or video frequency signals which are intended to be amplified to provide a high power stable output with distortionless reproduction and, as such, forms no part of the present invention. The amplifier has a wide variety of uses and typically may be incorporated in high efficiency, high fidelity sound reproduction systems; in servo amplifier systems wherein faithful reproduction of input signals is required while maintaining proper phase relationships; in variable frequency generators requiring constant amplitude output signals at varying load requirements; or in diverse systems requiring high quality amplification of audio or video signals.

Coupling transformer 11 is preferably of a type having balanced unity coupled secondary windings 12 and 13 to minimize distortion and to provide equal signal strengths to each of two push-pull circuit paths comprising transistors 20, 40, 50 and 30, 60, 70 respectively, and may be wound in unity coupled fashion in accordance with the present invention to assure application of equal voltages in each path.

The secondary of transformer 11 comprises windings 12 and 13 joined together at one end and supplied with a source of positive potential, with respect to a point of reference potential indicated as being grounded, over conductor 16. The direct current supply for this amplifier is indicated as B−, B+ and furnishes a proper bias to conductor 16 by means of bleeder resistor 17, 18. The direct current supply may be any suitable source of well regulated voltage known in the art. The other end of each of windings 12 and 13 is connected to the base electrode 21, 31 of driver transistors 20, 30 respectively.

Transistors 20, 30 are arranged in common collector fashion with the collector electrodes 22, 32 connected to a point of reference potential illustrated in Fig. 1 as being grounded. The corresponding emitter electrodes 23, 33 are each connected by direct coupling to the base electrodes 41, 51, 61 and 71 of output transistors 40, 50, 60 and 70 through stabilizing resistors 24, 25, 34, 35. The output transistors are also connected in common collector fashion with the collector electrodes 42, 52, 62 and 72 connected to ground. The emitter electrode of a first output transistor in one of the signal paths is connected to the emitter electrode of a first output transistor in the other signal path through two substantially unity coupled primary windings. The emitter electrode of a second output transistor in such first signal path is similarly connected to the emitter electrode of a second output transistor in such second signal path through two correspondingly substantially unity coupled primary windings. More particularly, emitter electrode 43 of transistor 40 is connected to emitter electrode 63 of transistor 60 through conductors 44, 45 and primary windings 5, 2. Emitter electrode 53 of transistor 50 is connected to emitter electrode 73 of transistor 70 through conductors 64, 65 and primary windings 3, 6. The windings 5, 2 and 3, 6 form the primary side of output transformer 80 and will be more completely described hereinafter with reference to Figs. 2 and 3 where like parts are identified by like numerals. Primary windings 5, 2 and 3, 6 are connected to the positive source of direct voltage through conductors 81, 82 and 83.

Transformer 80 merely by way of illustration is shown as having three secondary windings 7, 1, and 4. The opposite ends of secondary winding 7 are connected to an output system 90 through conductors 93 and 94. A degenerative feedback path which contributes to a flat frequency response is illustrated as being connected from conductor 94 through capacitor 91 and resistor 92 to the input system 10. Output system 90 may be any type of reactive, resistive or combination type load circuit requiring varying degrees of power with faithful signal reproduction at constant voltage amplitude levels while maintaining phase relationships. Fig. 1 also illustrates two secondary windings 1, 4 which as hereinafter described with reference to Figs. 2 and 3 may also be wound with substantially unity coupling as are the primaries in order to provide two balanced output signals. The opposite ends of windings 1 and 4 are connected through conductors 84, 85 and 86, 87 to output systems 88 and 89 respectively. It is understood that when windings 1 and 4 are wound in accordance with the present invention, the output systems 88 and 89 will receive substantially balanced amplitude signals irrespective of the relative power requirements of the two systems.

It is anticipated that this invention may be utilized with output transistors operating class A, class AB or class B, which class designations are well understood in the art. This particular arrangement is suitably adapted for class AB operation and is considered in that respect, without intention of limiting the invention in that regard.

In a constructed embodiment of the invention shown in Fig. 1, the following values were used, and these are listed herein merely by way of example and are not intended to limit the invention in any manner:

| | | |
|---|---|---|
| Transistors 20, 30 (Minneapolis-Honeywell) | | Type H7 |
| Transistors 40, 50, 60, 70 (Delco Radio) | | Type 2N174 |
| Resistors 24, 25, 34, 35, 92 | ohms | 75 |
| Resistor 17 | do | 30 |
| Resistor 18 | do | 6800 |
| Capacitor 91 | microfarads | 0.22 |
| Voltage supply | volts | 26 |

It has been determined that an amplifier constructed in accordance with Fig. 1 with four output transistors may readily deliver sixty watts of continuous output power with a frequency response of plus or minus 3 db from 20 cycles to 40 kilocycles per second with presently available transistors.

In operation, if it is assumed that a sine wave signal is applied to transformer 11, during a portion of the cycle the emitter-collector current through driver transistor 20 will increase while the emitter-collector current through driver transistor 30 will decrease. During that portion of the cycle, the emitter-collector current of output transistors 40, 50 will increase while the emitter-collector current of output transistors 60, 70 will decrease. The change of current through primary windings 5, 2 by conventional transformer action causes output signals in any or all of the connected output systems 88, 89 and/or 90 depending on the particular application for which the amplifier is being used. Conversely, during a different portion of the input signal, the emitter electrodes of output transistors 60, 70 increase their current while the emitter electrodes of output transistors 40, 50 decrease their current so that the change of current through primary windings 3, 6 of output transformer 80 by conventional transformer action causes output signals across the secondary windings.

The winding arrangement of the transformer is such that leakage inductance between the primary windings is minimized and, as pointed out in the aforementioned Sah article, such as improvement would tend to eliminate the switching transients caused by output transistors changing their conduction state during portions of the cycle.

Further, the winding arrangement of the invention permits of providing additional power for the output circuitry by allowing for additional pairs of push-pull output transistors for connection to further pairs of substantially unity coupled windings. The output transformer arrangement of the invention comprising a plurality of pairs of primary windings when connected to respective parallel pairs of push-pull signal output transistors, as described herein, obviates the need for selecting matched transistors by preventing interaction between said parallel transistors of unmatched character, or of inserting power consuming resistors in series with the output transformer primaries, which has been a major drawback to prior art transistor amplifiers. In other words, the use of a plurality of pairs of unity coupled primary windings allows unmatched transistors to be paralleled without harmful effects caused by different conduction characteristics of such transistors. In operation, the common collector, push-pull circuit of the present invention may be analogized to a cathode follower vacuum tube circuit, in that it provides considerable degeneration and therefore when connected as shown in Fig. 1, contributes to a flat wide-band frequency response.

A common collector arrangement as described is deemed preferable to prior art transistor circuits since it, by allowing a direct contact of the collector electrode to a heat sink, permits of more efficient heat dissipation and thus allows greater power drains while maintaining a stable output. Further, since a common collector arrangement of the invention has such a high amount of negative feedback, distortion is kept at a low level. This feature also is considered beneficial in that careful matching of transistors is not essential, nor do changing characteristics of transistors due to ageing greatly affect circuit performance.

Figure 2:
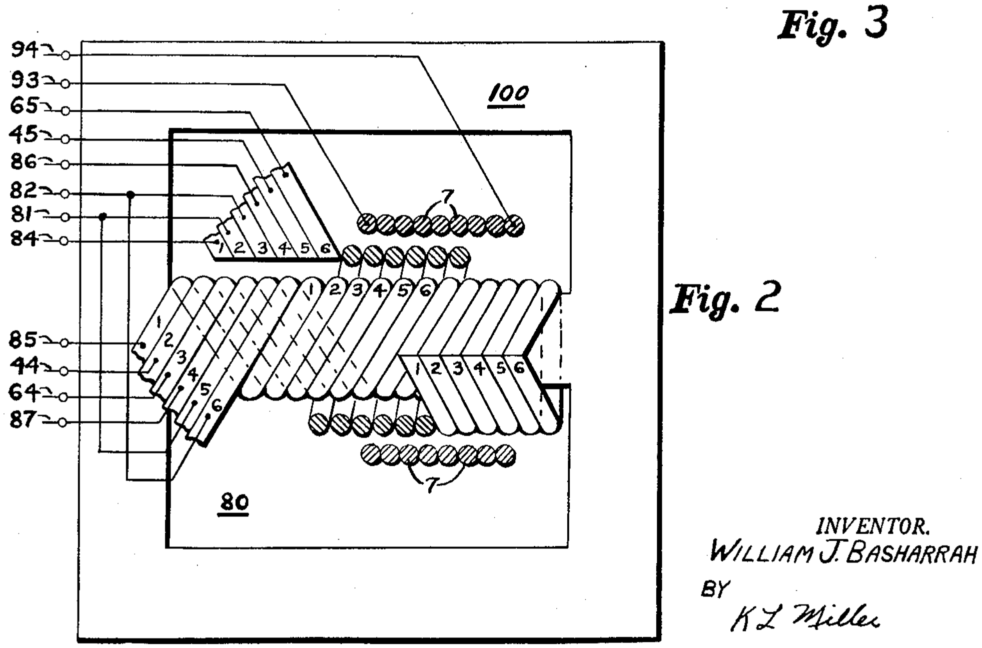
Fig. 2 is a view, showing one arrangement of a transformer having substantially unity coupled windings for use in parallel push-pull amplifiers arranged according to the present invention.

Attention is now directed to Fig. 2 for a typical transformer arrangement which is in accordance with the present invention. There is illustrated a core 100, of conventional and appropriate structure and material for the frequencies involved, having wound thereon a plurality of coils. Coils or windings 1, 2, 3, 4, 5 and 6 are wound about an arm of core 100 in side-by-side relationship with the turns of the respective coils maintaining their relative adjoining position throughout the entire winding as shown in Fig. 2. These respective turns are disposed as open helical turns with the same relative radius as the other corresponding turns and with each winding maintaining an equal number of turns. The windings 2–6 for example each have a turn interposed between adjacent turns of winding 1. The second layer of turns is shown as having the direction of winding opposite to the direction of winding of the first layer of turns while maintaining side-by-side relationship of the various turns. As used herein the term side-by-side considered with respect to the coil turns relates to turns maintained in the same relative layer about a core and being adjacent to one another. It is understood that as many layers or turns may be included as is necessary to arrive at the proper impedance match and the voltage desired. The windings 1–6 of Fig. 2 are substantially unity coupled since the turns are shown as if wound concurrently, with the turns of all six windings wound together in a group and with the turns of each in side-by-side relationship with respect to the corresponding turns of the others. Thus with a plurality of groups of winding turns in each layer, it is assured that each of the windings 1–6 will be equally matched in the circuit parameters of inductance, resistance and distributed capacity. It will be realized that this winding arrangement thus assures identical circuit parameters in the various primary windings, and also since the windings are substantially unity coupled, leakage inductance between the primary windings is minimized. Fig. 2 illustrates windings and connections suitable for a push-pull amplifier circuit such as that shown in Fig. 1 with the same identifying numerals to represent the same components and connections.

The second end of winding 2 is connected to a first end of winding 5 and forms conductor 81. The first end of winding 2 forms conductor 44 and a second end of winding 5 forms conductor 45. The conductors 44 and 45 are preferably connected to a first push-pull source of signals, while the conductor 81 is preferably connected to a source of supply voltage.

Similarly, a second end of winding 3 is connected to a first end of winding 6 and forms conductor 82. The first end of winding 3 forms conductor 64 and the second end of winding 6 forms conductor 65. The conductors 64 and 65 are preferably connected to a second push-pull source of signals in parallel with the above-mentioned first source of signals, while the conductor 82 is preferably connected to a source of supply voltage. It is of course understood that to increase the power output of the amplifier, additional windings such as 1 and 4 which are unity coupled and balanced in the manner aforementioned, may be connected as windings 2, 5 and 3, 6 to a further source of push-pull signals in parallel with the two above-mentioned signal sources. As shown however, windings 1 and 4 may also be connected to conductors 84, 85 and 86, 87 respectively and as shown in Fig. 1, may act as secondary windings connected to output systems 88 and 89, respectively, where it is required that the two outputs receive balanced amplitude signals and that core loss effects be minimized to improve regulation. Disadvantageous effects caused by unequal loading of secondaries are reduced when it is assured that each of the required secondary windings has identical characteristics with the other. While, for purposes of symmetry the ends of winding pairs 2, 5 and 3, 6 have been connected as shown, it is contemplated that physically opposite ends of any of the pairs of concurrently wound unity coupled turns such as windings 2, 3 and 4, 5 may be connected together to form conductors 81 or 82. It will be realized that a feature of the winding arrangement of this invention is that identical circuit parameters of the various windings can be maintained only if each layer contains an integral number of groups of adjacently disposed coil turns. Thus, with each of the layers of windings, as illustrated in Fig. 2, it is preferable to begin the return of the next layer of turns if there is insufficient available space on the arm of the frame 100 to place each of the turns of a group being wound adjacently in that same layer. Therefore, a group of turns of coils 1–6, for example, should not be split to form turns on two layers. With this precaution, there is an assurance that each of the unity coupled windings will have identical characteristics.

In Fig. 2, the secondary winding 7 is superposed on the unity coupled coils 1–6, it being understood that proper insulation is provided where needed. The ends of winding 7 form conductors 93, 94 which in turn are to be connected to the output system. It is to be appreciated that the leakage inductance between the various primaries and secondary winding 7 is not as detrimental to faithful signal reproduction as the leakage inductance between the respective primary windings of a push-pull output stage, and thus, winding 7 may be more loosely coupled for purposes of convenience in arriving at other than a 1:1 turns ratio between primary and secondary. It is contemplated that winding 7 may also be wound concurrently with windings 1–6 even though it may have a greater or lesser number of turns than those windings merely by terminating the winding of the coil 7 with the desired number of turns before or after the other unity coupled turns are terminated. When wound in that manner, the winding 7 would be substantially unity coupled with the other windings at least over a major portion of its length.

Figure 3:
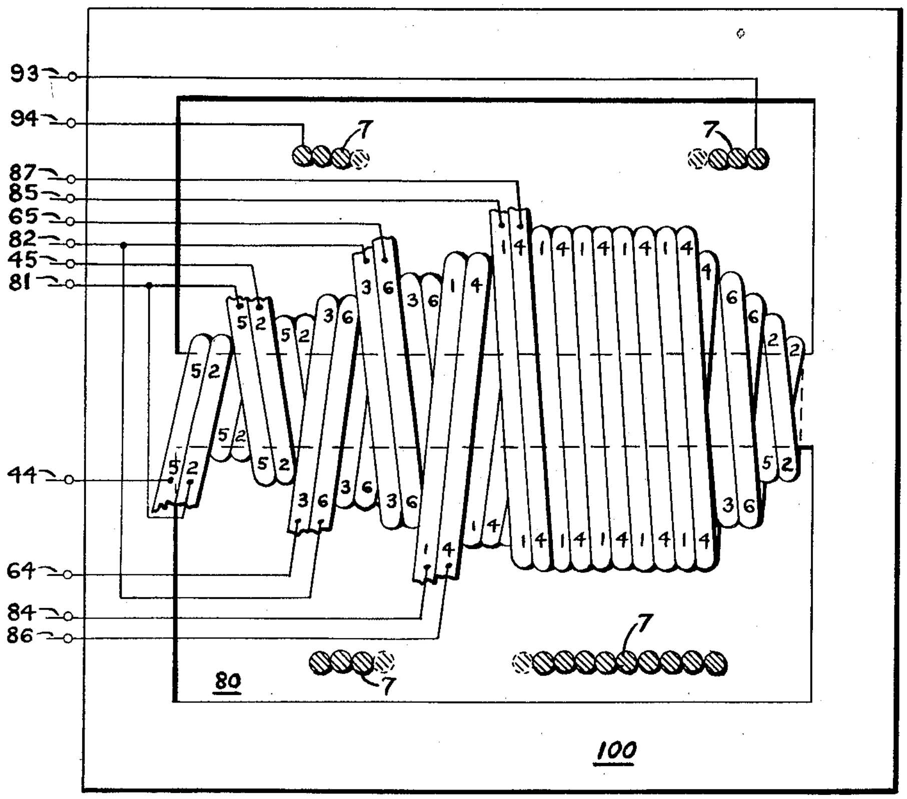
Fig. 3 represents a variation of the substantially unity coupled transformer of Fig. 2.

In Fig. 3 of the drawings there is illustrated a further modification of a transformer arrangement wherein the respective pairs of primary windings to be connected to paralleled push-pull sources are substantially unity coupled and have identical impedance characteristics. In this modification, coils 5 and 2 are adjacently disposed about a portion of a conventional core 100, to form a first layer, care being exercised that an integral number of groups of paired turns are contained in each layer to maintain identical parameters. The second and further layers of coils 5 and 2 are wound back upon the previous layers as illustrated in Fig. 3 to form the desired number of turns. A second end of winding 5 is connected to a first end of winding 2 to form conductor 81. A first end of winding 5 forms conductor 44 while a second end of winding 2 forms conductor 45. Windings 3 and 6 are illustrated as being adjacently disposed over the outermost layer of coils 5 and 2, and in the same manner as such coils. A second end of coil 3 is connected to a first end of coil 6 to form conductor 82. A first end of winding 3 forms conductor 64 while a second end of winding 6 forms conductor 65. Windings 1 and 4 are illustrated as being adjacently wound over the outermost layer of coils 3 and 6, and in the same manner as such coils. It is seen from Fig. 3 that the respective winding pairs 5, 2 and 3, 6 and 1, 4 have their turns disposed together in separate and distinct groups and that the completed pairs of windings may be considered as separate transformer sections or portions. The ends of coil 1 form conductors 84 and 85 while the ends of coil 4 form conductors 86 and 87 to provide, as shown in the embodiment of Fig. 1, two balanced identical secondary windings. It is understood that the coils 1 and 4 could be interconnected as coils 5, 2 and 3, 6 for connection to further paralleled push-pull sources in the event further power output is desired instead of additional secondary load circuits. Secondary winding 7 is superposed on the layers of unity coupled coils with the ends of winding 7 forming conductors 93 and 94 for connection to an output system. Although not shown, it is contemplated that the pairs of coils 5, 2 and 3, 6 and 1, 4 may be placed alongside one another to form three separate and distinct, but identical transformer sections about core 100 instead of each pair being placed over the outermost layer of the prior pair as described above.

Although a preferred embodiment of the invention has been described employing PNP transistors as push-pull signal devices connected to the substantially unity coupled primary windings of the output transformer, it is understood that NPN transistors may be employed, the manner of substitution being now well understood to those skilled in the art. Further, features of this invention may be used to advantage in push-pull circuits employing electronic devices other than transistors as described. The embodiment of the invention illustrated in Fig. 1 has its frequency response extended to accommodate higher frequencies than prior art amplifiers by means of the aforementioned output transformer, such as transformer 80 or input coupling transformer such as transformer 11 of Fig. 1, arrangements to minimize leakage inductance, and further by utilizing interwinding capacity hitherto considered disadvantageous and additional capacity provided across transformer windings, if necessary, to peak the transformer frequency characteristic and compensate for decreasing transistor frequency characteristics at higher frequencies, so as to provide an overall flat frequency response. In other words, it has been found with constructed embodiments according to the invention that the interwinding capacity is considered beneficial since it is used to tune the transformers such as 11 and 80 of Fig. 1 to peak at higher frequencies. Since the transistor response tends to fall off at these frequencies, an extended flat response is gained. Prior art amplifiers of lower current flow have been plaqued by such interwinding capacity instead of deriving benefits therefrom and thus prior winding schemes have concentrated efforts towards eliminating such capacity.

Having thus described the invention and its mode of operation, it is clear that certain modifications may be suggested to those skilled in the art which do not depart from the spirit or scope of the invention. Thus, the circuits and structures embodying the invention may be used wherever distortion-free high power circuit operation is required.

What is claimed is:

1. A transistor amplifier circuit including in combination, at least a first, a second, a third and a fourth transistor, each of said transistors having an emitter electrode, a collector electrode and a base electrode, first circuit means connecting said first and second transistors for push-pull operation, second circuit means connecting said third and fourth transistors for push-pull operation, a point of reference potential connected to each of said collector electrodes, input means for impressing signals to be amplified between a base and a collector electrode of said first and second transistors in phase opposition to one another and for impressing said same signals between a base and a collector electrode of said third and fourth transistors in phase opposition to one another, said first circuit means including a first winding connecting an emitter electrode of said first transistor and a second winding connecting an emitter electrode of said second transistor to a point of direct current potential with respect to said reference potential, said second circuit means including a third winding connecting an emitter electrode of said third transistor and a fourth winding connecting an emitter electrode of said fourth transistor to said point of direct current potential with respect to said reference potential, said first and second windings being wound in the same sense and being substantially unity coupled to one another, and said third and fourth windings being wound in the same sense and being substantially unity coupled to one another, and output circuit means coupled to said first and second circuit means for delivering undistorted output signals.

2. A transistor amplifier circuit as defined in claim 1 wherein the turns of all four said windings are wound together in a group having the turns of each in side-by-side relationship with respect to the corresponding turns of the others.

3. A transistor amplifier circuit as defined in claim 1 wherein the turns of said first and second windings are wound together in a group having each turn of the first in side-by-side relationship with respect to the corresponding turns of the second, and wherein the turns of said third and fourth windings are wound together in a separate and distinct group having each turn of the third in side-by-side relationship with respect to the corresponding turns of the fourth.

4. A transistor amplifier circuit including in combination, a first, a second, a third and a fourth transistor, each of said transistors having an emitter electrode, a collector electrode and a base electrode, first circuit means connecting said first and second transistors for push-pull operation, second circuit means connecting said third and fourth transistors for push-pull operation, a point of reference potential connected to each of said collector electrodes, input means for impressing signals to be amplified between a base and a collector electrode of said first and second transistors in phase opposition to one another and for impressing said same signals between a base and a collector electrode of said third and fourth transistors in phase opposition to one another, said first circuit means including a first winding connecting an emitter electrode of said first transistor and a second winding connecting an emitter electrode of said second transistor to a point of direct current potential with respect to said reference potential, said first and second windings being wound in the same sense, said second circuit means including a third winding connecting an emitter electrode of said third transistor and a fourth winding connecting an emitter electrode of said fourth transistor to said point of direct current potential with respect to said reference potential, said third and fourth windings being wound in the same sense, said first and second windings each comprising a plurality of open helical turns substantially corresponding in number of turns and radius of each turn as the turns of the other winding with each turn of each winding being interposed between adjacent turns of the other winding, and said third and fourth windings each comprising a plurality of open helical turns substantially corresponding in number of turns and radius of each turn as the turns of the other winding with each turn of each winding being interposed between adjacent turns of the other winding and an output circuit means coupled to said first and second circuit means for delivering undistorted output signals.

5. A direct coupled transistor amplifier circuit comprising two identical signal paths connected for push-pull signal operation, each path including a driver transistor and a plurality of output transistors each having a collector electrode, a base electrode, and an emitter electrode, said driver transistors connected in common collector fashion, direct coupling circuit means from an emitter electrode of said driver transistor in each of said paths to base electrodes of said plurality of output transistors in each of said paths so as to provide paralleled push-pull output signals, said direct coupling circuit means being the sole connection to said driver transistor emitter electrode, a first pair of substantially unity coupled output transformer windings wound in the same sense included in a circuit connected from an emitter electrode of an output transistor in one of said paths to an emitter electrode of an output transistor in the other of said paths, a further pair of substantially unity coupled output transformer windings wound in the same sense connected similarly in a circuit from an emitter electrode of a further output transistor in said first path to an emitter electrode of a further output transistor in said second path.

6. A direct coupled transistor amplifier circuit as defined in claim 5 wherein the windings of said first pair each comprises a plurality of open helical turns substantially corresponding in number of turns and radius of each turn as the turns of the other winding with each turn of each winding being interposed between adjacent turns of the other winding, and the windings of said further pair each comprises a plurality of open helical turns substantially corresponding in number of turns and radius of each turn as the turns of the other winding with each turn of each winding being interposed between adjacent turns of the other winding.

7. In electrical signal coupling apparatus, a transformer comprising a core, a plurality of pairs of windings associated with said core, a first winding of each of said pairs being substantially unity coupled to a second winding in its pair, said first winding of each of said pairs having a first end and a second end, said second winding in each of said pairs having a first end and a second end, connecting means from said second end of each of said first windings to said first end of each of said second windings in its respective pair, said connecting means of each of said pairs of windings including a first terminal, a second terminal connected to said first end of each of said respective first windings, a third terminal connected to said second end of each of said respective second windings, an emitter electrode of a first transistor connected to one of said second terminals, an emitter electrode of a second transistor connected to one of said third terminals, the emitter electrodes of third and fourth transistors connected to other of said second and third terminals respectively of said further pairs of windings, said first, second, third and fourth transistors being connected in common collector fashion, a source of direct current potential connected to said first terminal in each of said pairs of windings for providing power to said transistors.

8. Electrical signal coupling apparatus as defined in claim 7 wherein said first and second windings of a first pair of windings each comprises a plurality of open helical turns substantially corresponding in number of turns and radius of each turn as the turns of the other winding with each turn of each winding being interposed between adjacent turns of the other winding, and said first and second winding of a further pair of windings each comprises a plurality of open helical turns substantially corresponding in number of turns and radius of each turn as the turns of the other winding with each turn of each winding being interposed between adjacent turns of the other winding.

9. In electrical signal coupling apparatus, a transformer comprising a core, at least four windings about said core, each having a first and a physically opposite second end, first circuit means for connecting a second end of a first to a first end of a second of said windings, said first and second windings wound in the same sense, said first circuit means including a first terminal, second circuit means for connecting a second end of a third to a first end of a fourth of said windings, said third and fourth windings wound in the same sense, said second circuit means including a second terminal, a third terminal connected to a first end of said winding and a fourth terminal connected to a second end of said second winding for receiving output signals from a push-pull transistor amplifier, a fifth terminal connected to a first end of said third winding and a sixth terminal connected to a second end of said fourth winding for receiving further output signals from a further paralleled push-pull transistor amplifier, said first and second windings each comprising a plurality of open helical turns substantially corresponding in number of turns and radius of each turn as the turns of the other winding with each turn of each winding being interposed between adjacent turns of the other winding, and said third and fourth windings each comprising a plurality of open helical turns substantially corresponding in number of turns and radius of each turn as the turns of the other winding with each turn of each winding being interposed between adjacent turns of the other winding, said first and second circuit means adapted for connection to a source of direct current potential for providing power to said transistors.

10. A transistor amplifier including in combination, a first, a second, a third and a fourth transistor, each of said transistors having an emitter electrode, a collector electrode and a base electrode, first circuit means connecting said first and second transistors for push-pull operation, second circuit means connecting said third and fourth transistors for push-pull operation, a point of reference potential connected to each of said collector electrodes, input means for impressing signals to be amplified between a base and a collector electrode of said first and second transistors in phase opposition to one another, input means for impressing said same signals to be amplified between a base and a collector electrode of said third and fourth transistors in phase opposition to one another, said first circuit means including a first winding connecting an emitter electrode of said first transistor and a second winding connecting an emitter electrode of said second transistor to a point of direct current potential with respect to said reference potential, said first and second windings wound in the same sense, said second circuit means including a third winding connecting an emitter electrode of said third transistor and a fourth winding connecting an emitter electrode of said fourth transistor to said point of direct current potential with respect to said reference potential, said third and fourth windings wound in the same sense, a transformer core, said first and second windings each comprising a plurality of open helical turns substantially corresponding in number as the turns of the other winding with each turn of each winding being interposed between adjacent turns of the other winding, and said third and fourth windings each comprising a plurality of open helical turns substantially corresponding in number as the turns of the other winding with each turn of each winding being interposed between adjacent turns of the other winding, each of said four windings having a first and a second end and being coupled about said core, connecting means including said point of direct current potential from said second end of said first and third windings to said first end of said second and fourth windings respectively, connecting means from said remaining ends of said first and second windings to said first and second transistor emitter electrodes, and circuit means from said remaining ends of said third and fourth windings to said third and fourth transistor emitter electrodes, output circuit means coupled to said transformer core for delivering undistorted output signals.

11. A transistor amplifier circuit as defined in claim 10 wherein the turns of all four said windings are wound together in a group having the turns of each in side-by-side relationship with respect to the corresponding turns of the others.

12. A transistor amplifier circuit as defined in claim 10 wherein the turns of said first and second windings are wound together in a group having each turn of the first in side-by-side relationship with respect to the corresponding turns of the second, and wherein the turns of said third and fourth windings are wound together in a separate and distinct group having each turn of the third in side-by-side relationship with respect to the corresponding turns of the fourth.

References Cited in the file of this patent

UNITED STATES PATENTS

| | | |
|---|---|---|
| 2,316,370 | Smith et al. | Apr. 13, 1943 |
| 2,477,074 | McIntosh | July 26, 1949 |
| 2,761,917 | Aronson | Sept. 4, 1956 |
| 2,784,262 | Crow | Mar. 5, 1957 |
| 2,788,495 | Hylas et al. | Apr. 9, 1957 |
| 2,812,393 | Patrick | Nov. 5, 1957 |

FOREIGN PATENTS

| | | |
|---|---|---|
| 149,198 | Switzerland | Aug. 31, 1931 |
| 831,415 | Germany | Feb. 14, 1952 |

OTHER REFERENCES

QST, April 1954, pp. 26–31 and 118, "Case for AB, Linear" by George Grammer.

"High Fidelity Power Amplifiers" from "Radio Electronics," May 1956, pp. 59–62.